United States Patent
Park

(10) Patent No.: US 9,882,163 B2
(45) Date of Patent: Jan. 30, 2018

(54) DISPLAY DEVICE HAVING A GROOVE THAT PARTIALLY ACCOMMODATES SEALING MATERIAL AND MANUFACTURING METHOD THEREOF

(71) Applicant: Samsung Display Co., Ltd., Yongin, Gyeonggi-do (KR)

(72) Inventor: Cheondeok Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/657,944

(22) Filed: Mar. 13, 2015

(65) Prior Publication Data

US 2016/0104863 A1 Apr. 14, 2016

(30) Foreign Application Priority Data

Oct. 10, 2014 (KR) .................. 10-2014-0136971

(51) Int. Cl.
*H01L 29/18* (2006.01)
*H01L 33/00* (2010.01)
*H01L 51/52* (2006.01)
*H01L 27/32* (2006.01)

(52) U.S. Cl.
CPC ........ *H01L 51/5246* (2013.01); *H01L 27/323* (2013.01)

(58) Field of Classification Search
CPC ............. H01L 27/3246; H01L 27/3244; H01L 51/5237; H01L 27/1214; H01L 51/524; H01L 51/56; H01L 2227/323; H01L 51/5284; H01L 27/323; H01L 27/322; G02F 1/133308; G02F 1/133345

USPC ........... 257/40, 88; 438/28; 313/512; 349/58
See application file for complete search history.

(56) References Cited

U.S. PATENT DOCUMENTS

| | | | |
|---|---|---|---|
| 2005/0045891 A1 | 3/2005 | Yamazaki et al. | |
| 2005/0218396 A1* | 10/2005 | Tsuchiya ............ | H01L 27/3246 257/13 |
| 2008/0030670 A1* | 2/2008 | Ishii ..................... | G02F 1/1341 349/153 |

(Continued)

FOREIGN PATENT DOCUMENTS

| JP | 2005-78946 A | 3/2005 |
|---|---|---|
| JP | 2005-209497 A | 8/2005 |

(Continued)

*Primary Examiner* — Lex Malsawma
*Assistant Examiner* — Nduka Ojeh
(74) *Attorney, Agent, or Firm* — Knobbe Martens Olson & Bear LLP

(57) ABSTRACT

A display device is disclosed. In one aspect, the device includes first and second substrates each including a display area and a non-display area around the display area, a plurality of pixels formed in the display area of the first substrate and an internal circuit unit formed in the non-display area of the first substrate and electrically connected to the pixels. The device further includes a sealing member formed between the non-display areas of the first and second substrates to surround the display areas. The sealing member includes a first portion and a second portion, the second portion surrounded by the first portion and at least partially overlapping the internal circuit unit, and a groove is formed in the second substrate at a position corresponding to the second portion of the sealing member.

18 Claims, 6 Drawing Sheets

(56) References Cited

U.S. PATENT DOCUMENTS

| | | | |
|---|---|---|---|
| 2011/0084321 A1* | 4/2011 | Tsurume | H01L 27/1266 257/288 |
| 2011/0248965 A1 | 10/2011 | Suh | |
| 2014/0028616 A1* | 1/2014 | Furutani | G06F 3/044 345/174 |
| 2015/0185539 A1* | 7/2015 | Senokuchi | H05B 33/04 349/58 |
| 2015/0270508 A1* | 9/2015 | Naito | C03C 8/24 257/40 |
| 2015/0301370 A1* | 10/2015 | Moriwaki | G02F 1/1339 349/42 |

FOREIGN PATENT DOCUMENTS

| | | |
|---|---|---|
| KR | 10-2009-0084147 A | 8/2009 |
| KR | 10-2011-0067261 A | 6/2011 |

\* cited by examiner

DISPLAY DEVICE HAVING A GROOVE THAT PARTIALLY ACCOMMODATES SEALING MATERIAL AND MANUFACTURING METHOD THEREOF

CROSS-REFERENCE TO RELATED APPLICATIONS

This application claims the benefit of Korean Patent Application No. 10-2014-0136971, filed on Oct. 10, 2014, in the Korean Intellectual Property Office, the disclosure of which is incorporated herein in its entirety by reference.

BACKGROUND

Field

The described technology generally relates to a display device and a method of manufacturing the display device.

Description of the Related Technology

Display devices, such as organic light-emitting diode (OLED) displays including thin film transistors (TFTs), are widely used in mobile devices such as smartphones, tablet personal computers, ultra slim laptop computers, digital cameras, video cameras, or personal digital assistants, and electronic/electric products such as ultra slim televisions.

A gap formed between upper and lower display substrates and containing organic pixel layers is sealed to protect the pixels from environmental agents such as moisture that are harmful to organic compounds. The lifetime of an OLED display can be extended by improving the sealing process.

SUMMARY OF CERTAIN INVENTIVE ASPECTS

One inventive aspect is a display device and a method of manufacturing the display device.

Another aspect is a display device that includes: first and second substrates each including an active area and a dead area around the active area; a plurality of pixels formed in the active area of the first substrate; an internal circuit unit formed in the dead area of the first substrate and electrically connected to the pixels; and a sealing member formed between the dead areas of the first and second substrates to surround the active areas, wherein the sealing member includes a first portion and a second portion, the second portion being formed inside the first portion and overlapped with the internal circuit unit, and the second substrate includes a groove formed at a position corresponding to the second portion of the sealing member.

An upper part of the second portion may be accommodated in the groove.

The first portion may be a portion cured using a laser, and the second portion may be a non-cured portion.

The first portion may have a height smaller than that of the second portion.

The display device may further include a touch electrode pattern formed on the second substrate.

An end portion of the touch electrode pattern may overlap the second portion of the sealing member.

The touch electrode pattern may be formed on a first surface of the second substrate, and the groove may be formed in a second surface of the second substrate, the second surface being opposite the first surface and facing the first substrate.

The dead area of the first substrate may include: a sealing area relatively distant from the active area of the first substrate, the sealing member being formed on the sealing area; and an internal circuit area relatively close to the active area of the first substrate, the internal circuit unit being formed on the internal circuit area, wherein the sealing area and the internal circuit area may be partially overlapped with each other, the first portion of the sealing member may be formed in a region of the sealing area not overlapping the internal circuit area, and the second portion of the sealing member may be formed in a region of the sealing area overlapping the internal circuit area.

According to one or more exemplary embodiments, a method of manufacturing a display device includes: preparing a first substrate, the first substrate including an active area in which a plurality of pixels are formed and a dead area in which an internal circuit unit electrically connected to the pixels is formed, the dead area being formed around the active area; forming a sealing material in the dead area of the first substrate, a portion of the sealing material being overlapped with the internal circuit unit; disposing a second substrate above the first substrate, the second substrate including a groove formed at a position corresponding to the portion of the sealing material overlapped with the internal circuit unit; and curing the sealing material.

The forming of the sealing material may include: applying paste including an inorganic material; and drying and firing the paste to form the sealing material.

The sealing material may include: a first portion not overlapping the internal circuit unit; and a second portion formed inside the first portion and overlapping the internal circuit unit.

The curing of the sealing material may include curing the first portion of the first and second portions by casting light to the first portion.

The second substrate may include a touch electrode pattern formed thereon.

The touch electrode pattern may be formed on a first surface of the second substrate, and the groove may be formed in a second surface of the second substrate opposite the first surface.

In the disposing of the second substrate above the first substrate, an end portion of the touch electrode pattern may be formed above the portion of the sealing member overlapped with the internal circuit unit.

Another aspect is a display device, comprising: first and second substrates each comprising a display area and a non-display area surrounding the display area; a plurality of pixels formed in the display area of the first substrate; an internal circuit unit formed in the non-display area of the first substrate and electrically connected to the pixels; and a sealing member formed between the non-display areas of the first and second substrates to surround the display areas, wherein the sealing member comprises a first portion and a second portion, the second portion surrounded by the first portion and at least partially overlapping the internal circuit unit, and wherein a groove is formed in the second substrate at a position corresponding to the second portion of the sealing member.

In the above display device, an upper part of the second portion is accommodated in the groove. In the above display device, the first portion is a cured portion, and wherein the second portion is a non-cured portion. In the above display device, the first portion has a height less than that of the second portion. The above display device further comprises a touch electrode pattern formed over the second substrate. In the above display device, an end portion of the touch electrode pattern at least partially overlaps the second portion of the sealing member. In the above display device, the touch electrode pattern is formed on a first surface of the second substrate, and wherein the groove is formed in a second surface of the second substrate, the second surface being opposite the first surface and facing the first substrate.

In the above display device, the non-display area of the first substrate comprises: a sealing area in which the sealing member is formed; and an internal circuit area in which the internal circuit unit is formed, wherein at least a portion of the sealing area is farther from the display area than the internal circuit area, wherein the sealing area and the internal circuit area at least partially overlap each other, wherein the first portion of the sealing member is formed in a region of the sealing area not overlapping the internal circuit area, and wherein the second portion of the sealing member is formed in a region of the sealing area overlapping the internal circuit area.

Another aspect is a method of manufacturing a display device, the method comprising: providing a first substrate, the first substrate comprising a display area in which a plurality of pixels are formed and a non-display area in which an internal circuit unit electrically connected to the pixels is formed, the non-display area surrounding the display area; forming a sealing material in the non-display area of the first substrate, a portion of the sealing material overlapping the internal circuit unit; placing a second substrate above the first substrate, the second substrate having a groove formed at a position corresponding to the portion of the sealing material; and curing the sealing material.

In the above method, the forming of the sealing material comprises: applying paste comprising an inorganic material; and drying and firing the paste to form the sealing material. In the above method, the sealing material comprises: a first portion not overlapping the internal circuit unit; and a second portion surrounded by the first portion and at least partially overlapping the internal circuit unit. In the above method, the curing of the sealing material comprises curing the first portion by casting light to the first portion. In the above method, the second substrate comprises a touch electrode pattern formed thereon. In the above method, the touch electrode pattern is formed on a first surface of the second substrate, and wherein the groove is formed in a second surface of the second substrate opposite to the first surface. In the above method, an end portion of the touch electrode pattern is formed above the portion of the sealing member overlapping the internal circuit unit.

Another aspect is a display device, comprising: first and second substrates each comprising a display area and a non-display area adjacent to the display area; an internal circuit unit formed in the non-display area; and a sealing member formed between the non-display areas of the first and second substrates to surround the display areas, wherein the sealing member comprises a first portion and a second portion, and wherein a first distance between the first and second substrates corresponding to the first portion of the sealing member is less than a second distance between the first and second substrates corresponding to the second portion of the sealing member.

In the above display device, a groove is formed in the second substrate at a position corresponding to the second portion of the sealing member. In the above display device, an upper part of the second portion is inserted into the groove. The above display device further comprises a touch electrode pattern formed over the second substrate, wherein at least a portion of the groove is formed directly below the touch electrode pattern.

DETAILED DESCRIPTION OF CERTAIN INVENTIVE EMBODIMENTS

Figure 1:
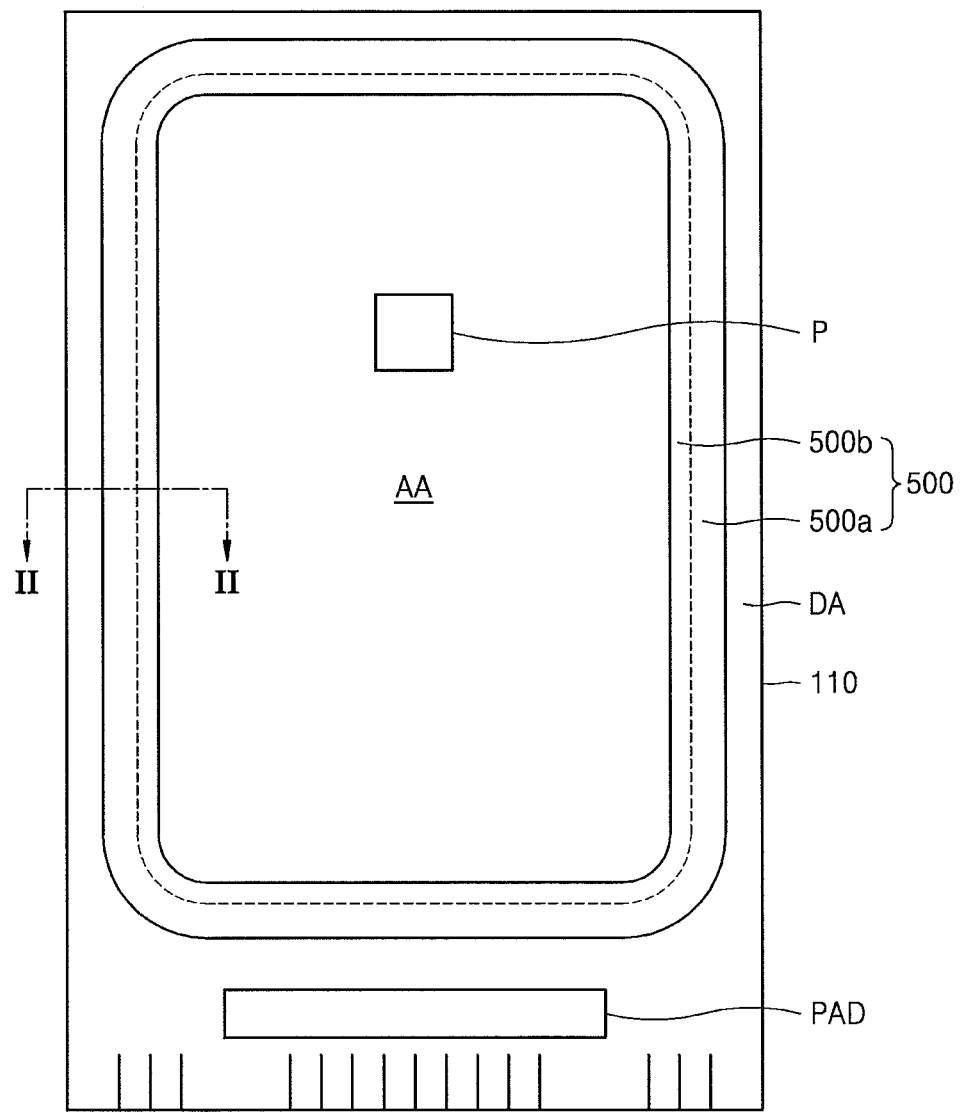
FIG. 1 is a schematic plan view illustrating a display device according to an exemplary embodiment.

Reference will now be made in detail to exemplary embodiments, examples of which are illustrated in the accompanying drawings. Effects and features of the exemplary embodiments, and implementation methods thereof will be clarified through the following descriptions given with reference to the accompanying drawings. In this regard, the exemplary embodiments may have different forms and should not be construed as being limited to the descriptions set forth herein. As used herein, the term "and/or" includes any and all combinations of one or more of the associated listed items.

Hereinafter, the exemplary embodiments will be described in detail with reference to the accompanying drawings. In the drawings, like reference numerals denote like elements, and overlapping descriptions thereof will be omitted.

In the following descriptions of the exemplary embodiments, although the terms "first" and "second" are used to describe various elements, these elements should not be limited by these terms. These terms are only used to distinguish one element from another element.

In the following descriptions of the exemplary embodiments, the terms of a singular form may include plural forms unless referred to the contrary.

It will be understood that when a film, a region, or an element is referred to as being "above" or "on" another film, region, or element, it can be directly on the other film, region, or element, or intervening films, regions, or elements may also be present.

In the drawings, the sizes of elements may be exaggerated for clarity. For example, in the drawings, the size or thickness of each element may be arbitrarily shown for illustrative purposes, and thus the inventive concept should not be construed as being limited thereto.

The order of processes explained in one embodiment may be changed in a modification of the embodiment or another embodiment. For example, two processes sequentially explained may be performed substantially at the same time or in the reverse of the explained order. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Referring to FIG. 1, a first substrate 110 of the display device includes an active area or display area AA in which a plurality of pixels P are formed to display images, and a dead area, inactive area or non-display area DA formed outside the active area AA to surround the active area AA. The dead area DA may include an internal circuit unit 300 (refer to FIG. 2) for driving the active area AA, and a pad unit PAD extending from lines of the active area AA.

The display device includes the first substrate 110 and a second substrate 410 (refer to FIG. 2), and the first and second substrates 110 and 410 are attached together by a sealing member 500 formed in the dead area DA.

The sealing member 500 can surround the active area AA. The sealing member 500 includes a first portion 500a as an outer portion and a second portion 500b as an inner portion. The first portion 500a of the sealing member 500 is farther from the active area AA than the second portion 500b.

Figure 2:
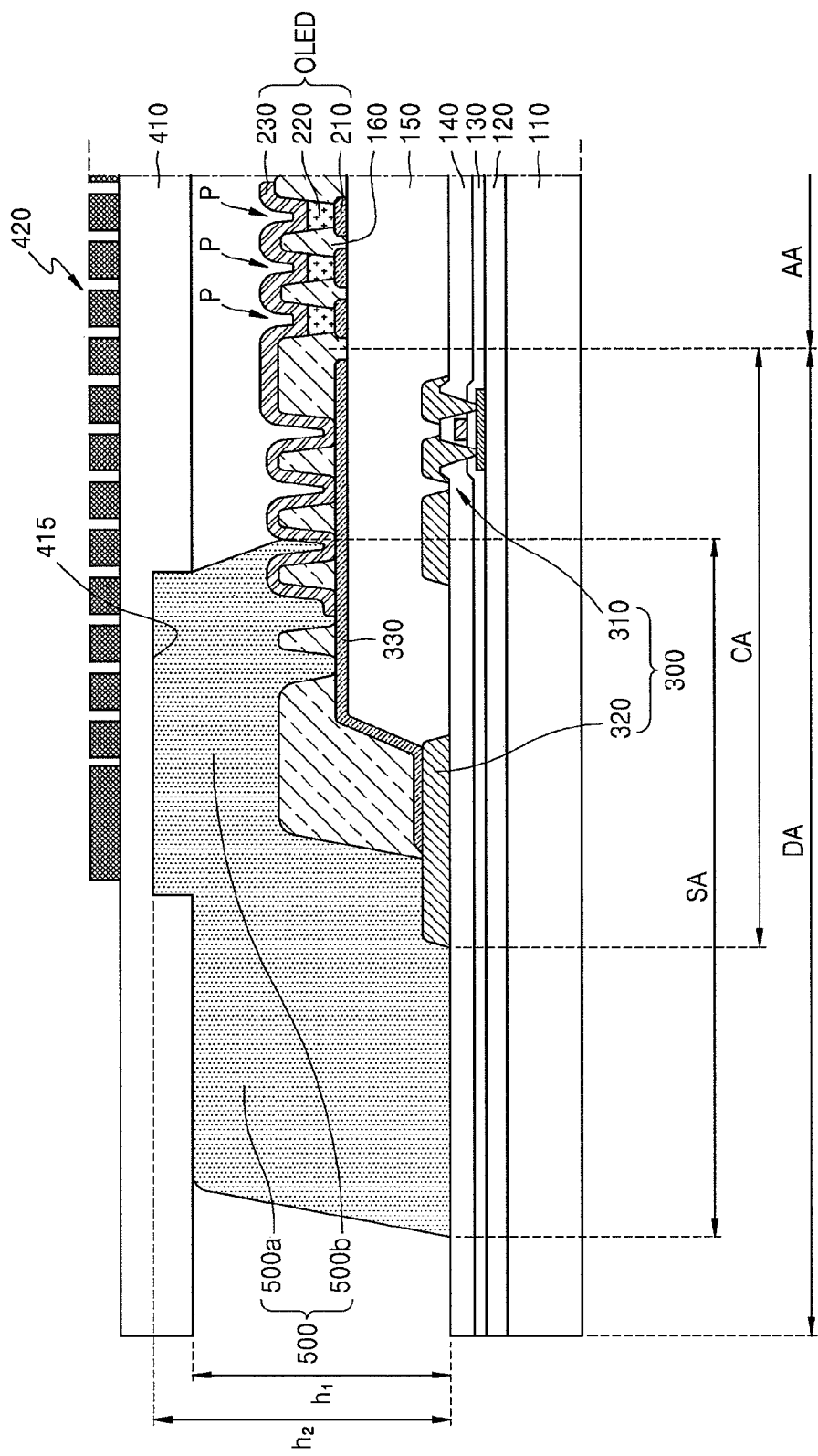
FIG. 2 is a cross-sectional view taken along line II-II of FIG. 1 to illustrate the display device according to the exemplary embodiment.

Referring to FIG. 2, the active area AA and the dead area DA are formed on the first substrate 110. The dead area DA includes a sealing area SA in which the sealing member 500 is formed to attach the first and second substrates 110 and 410 together, and a circuit area CA in which the internal circuit unit 300 is formed.

The active area AA includes pixel circuits including thin film transistors (TFTs) (not shown), and light-emitting devices such as organic light-emitting diodes (OLEDs).

The first substrate 110 may be a low-temperature polycrystalline silicon (LTPS) substrate, a glass substrate, or a plastic substrate.

Layers formed on the first substrate 110 may include a buffer layer 120, a first insulation layer 130, a second insulation layer 140 and a third insulation layer 150. The buffer layer 120 can substantially prevent the ingress of impurities into a semiconductor layer of the TFTs. The first insulation layer 130 can function as a gate insulation layer for insulating the semiconductor layer and gate electrodes of the TFTs. The second insulation layer 140 can function as an interlayer insulation layer for insulating source electrodes and drain electrodes of the TFTs from the gate electrodes of the TFTs. The third insulation layer 150 can function as a planarization layer having an approximately flat upper surface and covering the TFTs.

The OLEDs may include pixel electrodes 210, an intermediate layer 220 including a light-emitting layer, and a counter electrode 230. The OLEDs form the pixels P and may be connected to the pixel circuits (not shown) including the TFTs and capacitors for driving the OLEDs.

The pixel electrodes 210 are respectively formed in the pixels P by patterning the third insulation layer 150. A fourth insulation layer 160 having openings through which upper portions of the pixel electrodes 210 are exposed is formed on the pixel electrodes 210 as a pixel defining layer.

The intermediate layer 220 including the light-emitting layer is formed in the openings of the fourth insulation layer 160 which is a pixel defining layer. The light-emitting layer may include a low molecular weight organic material and/or a polymer organic material. In addition to the light-emitting layer, the intermediate layer 220 may further include one or more of a hole injection layer (HIL), a hole transport layer (HTL), an electron transport layer (ETL), and an electron injection layer (EIL). In the current exemplary embodiment, the intermediate layer 220 may further include various function layers. However, the intermediate layer 220 is not limited thereto.

The counter electrode 230 may be formed as one layer corresponding to the pixels P. An end of the counter electrode 230 may extend to the dead area DA and may be electrically connected to a power line 320 of the internal circuit unit 300.

The dead area DA may include the internal circuit area CA adjoining the active area AA, and the sealing area SA formed more outside than the internal circuit area CA and overlapped with the internal circuit area CA. Since the sealing area SA at least partially overlaps the internal circuit area CA, the size of the dead area DA of the display is reduced, and thus a slim bezel may be formed.

In the internal circuit area CA, the internal circuit unit 300 is formed to receive signals from a driving unit such as a data driving unit or a gate driving unit and transmit the signals to the active area AA. The internal circuit unit 300 may include devices such as TFTs 310 and lines such as the power line 320.

The power line 320 may be electrically connected to the counter electrode 230 to apply a predetermined voltage to the counter electrode 230. The power line 320 and the counter electrode 230 may be electrically connected to each other through a conductive layer 330. The conductive layer 330 and the pixel electrodes 210 may be formed in the same layer by using the same material.

The fourth insulation layer 160 being a pixel defining layer may extend to the internal circuit area CA and may include a plurality of openings through the conductive layer 330 is exposed. The conductive layer 330 exposed through the openings of the fourth insulation layer 160 may be in contact with the counter electrode 230, and an end of the conductive layer 330 may be in contact with the power line 320, such that the power line 320 and the counter electrode 230 may be connected.

The sealing member 500 is formed in the sealing area SA. The sealing member 500 includes the first portion 500a formed outside the internal circuit area CA, and the second portion 500b at least partially overlapping the internal circuit area CA (or the internal circuit unit 300). The sealing member 500 may include an inorganic material.

A method of decreasing the sealing area SA of the display device may be used so as to reduce the size of the dead area DA of the display device and thus to satisfy an increasing demand for slim-bezel display apparatuses. That is, the width of the sealing member 500 may be reduced to decrease the sealing area SA. In this case, the coupling strength between the first and second substrates 110 and 410 may be lowered.

However, according to some embodiments, since a portion of the sealing member 500 (that is, the second portion 500b of the sealing member 500) at least partially overlaps the internal circuit unit 300, the size of the dead area DA of the display device is decreased without reducing the width of the sealing member 500. That is, a slim bezel may, be formed while guaranteeing sufficient sealing.

A touch electrode pattern 420 may be formed on top of the second substrate 410. The touch electrode pattern 420 may be formed by directly patterning the second substrate 410 so as to reduce manufacturing costs and the entire thickness of the display apparatus. The touch electrode pattern 420 of the second substrate 410 may overlap the internal circuit unit 300 formed on the first substrate 110.

The first and second substrates 110 and 410 are attached together by disposing the sealing member 500 between the first and second substrates 110 and 410 and curing the sealing member 500 using light such as laser beams. That is, a photocuring process may be performed by arranging the first and second substrates 110 and 410 to face each other and casting light such as laser beams from an upper side of the second substrate 410. Owing to the touch electrode pattern 420 formed on the second substrate 410, light is cast to only the first portion 500a of the first and second portions 500a and 500b of the sealing member 500, and then while the first portion 500a of the sealing member 500 is melted and then hardened, the first and second substrates 110 and 410 may be attached to each other.

Since a portion of the sealing member 500 is cured, the sealing member 500 may have different thicknesses according to regions thereof. Since the first portion 500a of the sealing member 500 shrinks while being cured, the thickness h1 of the first portion 500a is smaller than the thickness h2 of the second portion 500b which is not cured. A groove 415 is formed in the second substrate 410 to receive the second portion 500b.

The groove 415 of the second substrate 410 is formed at a position corresponding to the second portion 500b of the sealing member 500 so as to insert the second portion 500b in the groove 415. If the groove 415 is not formed in the second substrate 410, the lines or devices of the internal circuit unit 300 formed under the non-cured second portion 500b may be depressed by the non-cured second portion 500b.

However, according to some embodiments, since an upper portion of the non-cured second portion 500b is accommodated in the groove 415 of the second substrate 410, the lines or devices of the internal circuit unit 300 may be minimally depressed or may not be depressed by a thickness difference between the first and second portions 500a and 500b.

FIGS. 3 to 6 are cross-sectional views illustrating a method of manufacturing a display device according to an exemplary embodiment.

Figure 3:
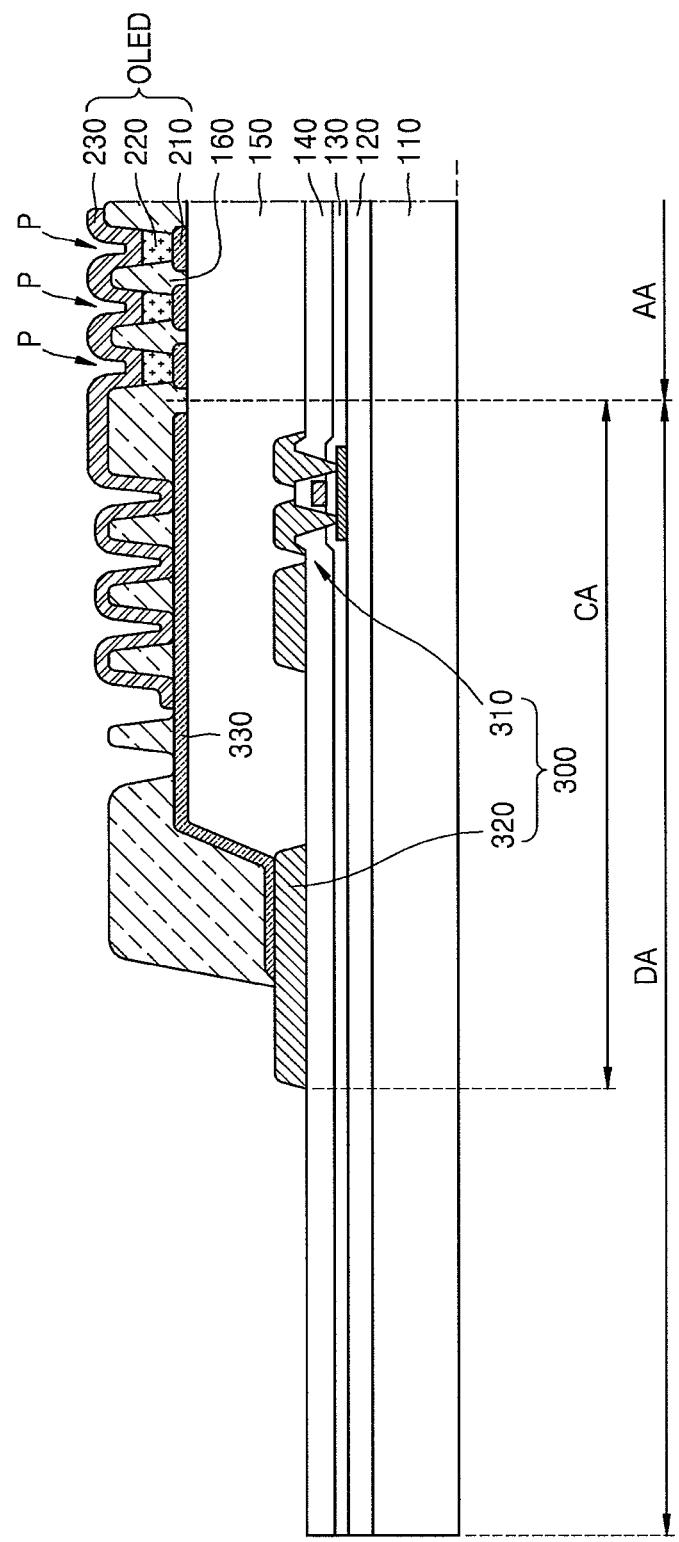
FIGS. 3 to 6 are cross-sectional views illustrating a method of manufacturing a display device according to an exemplary embodiment.

Referring to FIG. 3, a first substrate 110 including an active area AA and a dead area DA surrounding the active area AA is prepared. A plurality of pixels P are formed in the active area AA of the first substrate 110, and an internal circuit unit 300 is formed in the dead area DA of the first substrate 110 in electric connection with the pixels P.

The pixels P formed in the active area AA may include OLEDs. The OLEDs may include pixel electrodes 210, an intermediate layer 220 formed in openings of a fourth insulation layer 160 which is a pixel defining layer and a counter electrode 230. The counter electrode 230 of the OLEDs may extend to the dead area DA and may be electrically connected to a power line 320 of the internal circuit unit 300. The power line 320 and the counter electrode 230 may be electrically connected to each other through a conductive layer 330. The conductive layer 330 and the pixel electrodes 210 may be formed in the same layer by using the same material.

In an exemplary embodiment, the fourth insulation layer 160 being a pixel defining layer may extend to an internal circuit area CA and may include a plurality of openings through which the conductive layer 330 is exposed. The conductive layer 330 exposed through the openings of the fourth insulation layer 160 may be in contact with the counter electrode 230, and an end of the conductive layer 330 may be in contact with the power line 320, such that the power line 320 and the counter electrode 230 may be connected.

Since the fourth insulation layer 160 formed in the internal circuit area CA includes the openings through which the conductive layer 330 is exposed, the surface of the fourth insulation layer 160 may include convex and concave portions. Owing to the convex and concave portions of the fourth insulation layer 160, the contact area between the fourth insulation layer 160 and a second portion 500b of a sealing member 500 may be increased.

Figure 4:
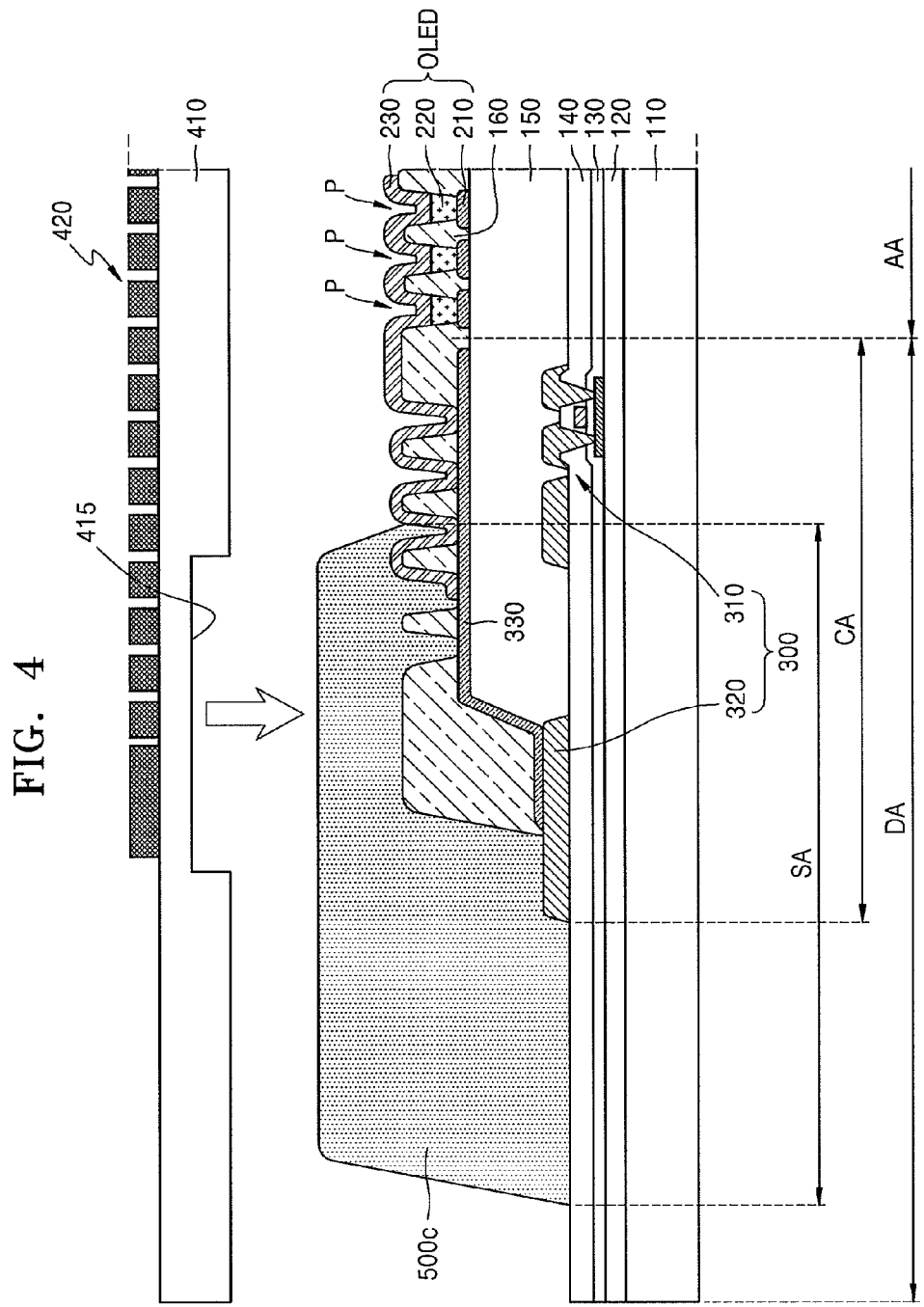

Referring to FIG. 4, a sealing material 500c is formed in the dead area DA of the first substrate 110. The sealing material 500c at least partially overlaps the internal circuit unit 300. Therefore, a sealing area SA in which the sealing material 500c is formed at least partially overlaps the internal circuit area CA in which the internal circuit unit 300 is formed.

Paste formed by dispersing an inorganic material into an organic solvent may be applied to the first substrate 110, and may then be dried and fired to vaporize the organic solvent included in the paste. In this way, the sealing material 500c may be formed. In the current exemplary embodiment, the sealing material 500c refers to a material obtained by dispersing an inorganic material into an organic solvent to form paste, and drying and firing the paste to vaporize the organic solvent.

Thereafter, a second substrate 410 is formed on the first substrate 110 on which the sealing material 500c is formed.

A touch electrode pattern 420 may be formed on a first surface of the second substrate 410. An end of the touch electrode pattern 420 may extend to a position corresponding to the internal circuit unit 300.

The second substrate 410 includes a groove 415. A second surface of the second substrate 410 faces the first substrate 110, and the groove 415 may be formed in the second surface of the second substrate 410 at a position corresponding to the internal circuit unit 300.

Figure 5:
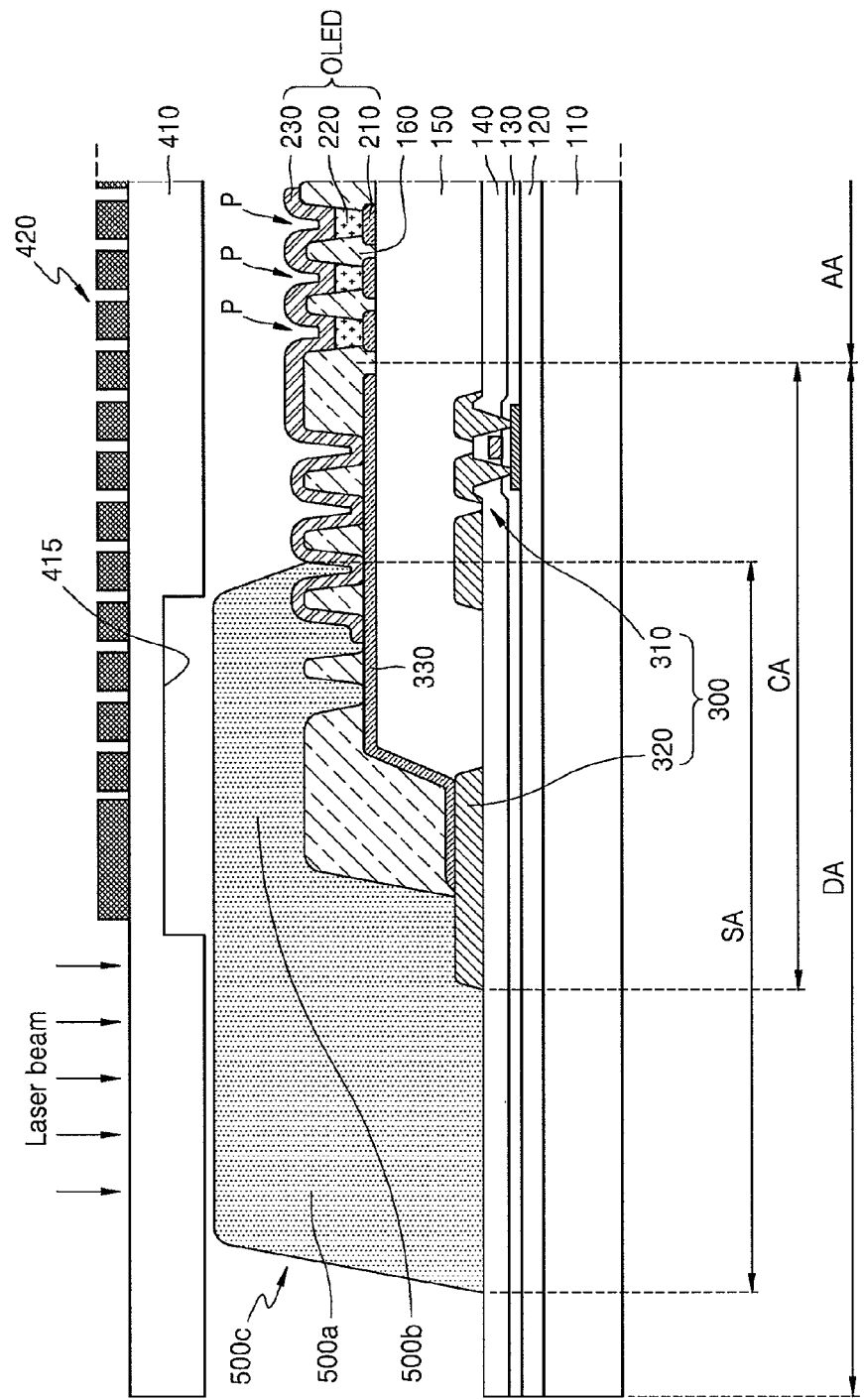

Referring to FIG. 5, light such as laser beams is cast to the sealing material 500c to cure the sealing material 500c. The sealing material 500c includes a first portion 500a formed in a region of the sealing area SA not overlapping the internal circuit area CA, and a second portion 500b formed in a region of the sealing area SA at least partially overlapping the internal circuit area CA. The first portion 500a of the first and second portions 500a and 500b is cured with light.

Figure 6:
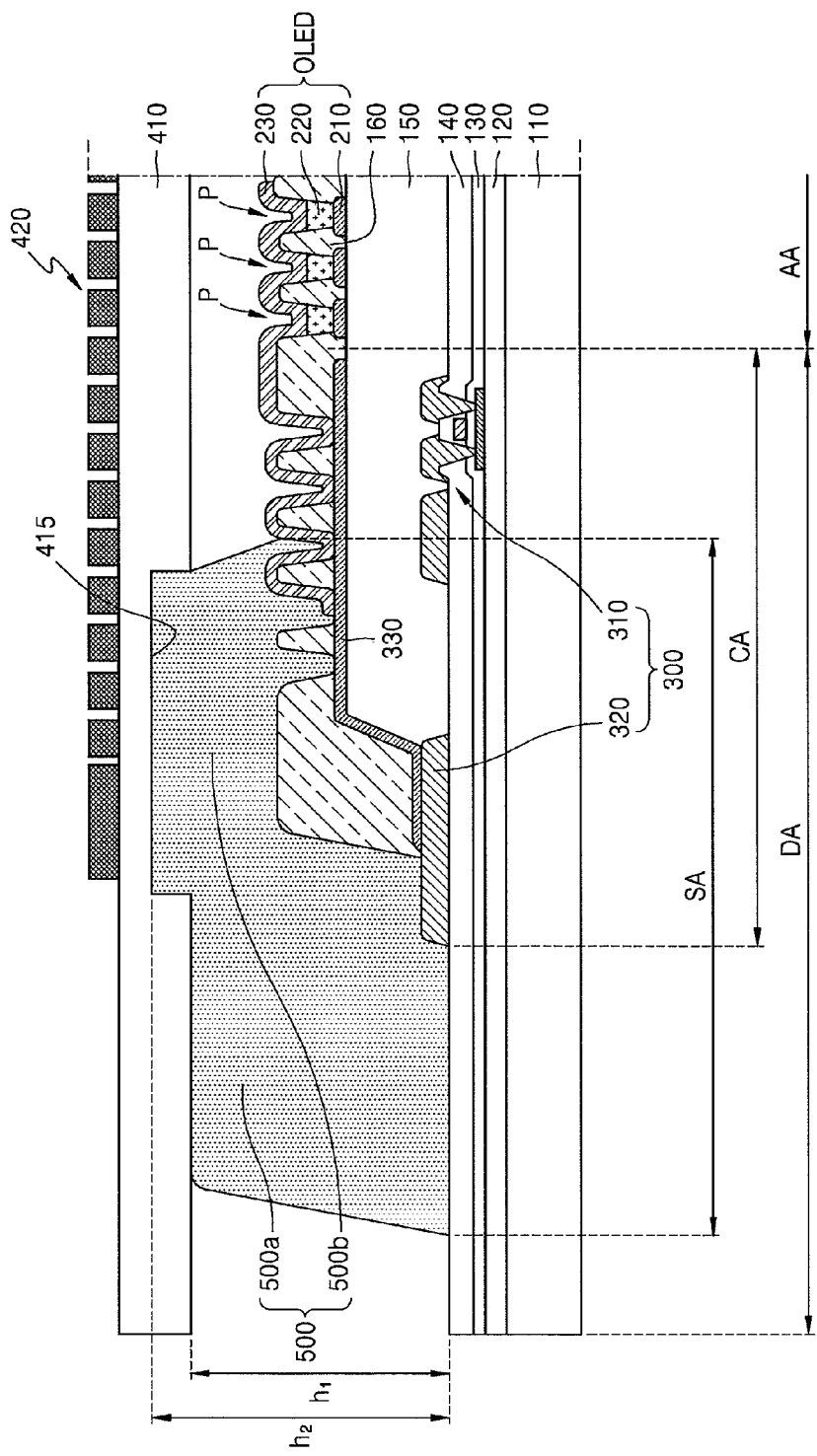

Referring to FIG. 6, the first and second substrates 110 and 410 are attached together as the first portion 500a is hardened after being melted by light such as laser beams. In the current exemplary embodiment, the sealing member 500 refers to a member formed by curing at least a portion of the sealing material 500c. That is, the sealing material 500c is formed into the sealing member 500 through a photocuring process, and the sealing member 500 includes the first portion 500a as a cured portion and the second portion 500b as a non-cured portion.

As the sealing material 500c is partially cured, the sealing member 500 has different thicknesses according to regions thereof. Since the first portion 500a of the sealing member 500 shrinks while being cured, the thickness h1 of the first portion 500a is smaller than the thickness h2 of the second portion 500b which is not cured. The second portion 500b is inserted in the groove 415 formed in the second substrate 410. Therefore, as described above, owing to the groove 415, lines or devices of the internal circuit unit 300 may be minimally depressed or may not be depressed.

In FIGS. 2, 5, and 6, the groove 415 formed in the second substrate 410 has a substantially rectangular shape. However, the groove 415 is not limited thereto. The groove 415 may have any shape as long as the groove 415 may receive the thickness of the second portion 500b.

In the above-described exemplary embodiments, the pixels include OLEDs, respectively. However, the described technology is not limited thereto. For example, in other embodiments, the pixels may be pixels of a liquid crystal display device.

As described above, according to the display device and the manufacturing method of the one or more of the above exemplary embodiments, the size of the dead area may be reduced, and the display device may be more reliably used.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A display device, comprising:
    first and second substrates each comprising a display area and a non-display area surrounding the display area, wherein the second substrate has thicker and thinner portions that do not overlap each other, and wherein the thicker portion has a thickness greater than that of the thinner portion;
    a plurality of pixels formed in the display area of the first substrate;
    an internal circuit unit formed in the non-display area of the first substrate and electrically connected to the pixels;
    an insulating layer interposed between and not directly contacting the first and second substrates, wherein the insulating layer at least partially overlaps the internal circuit unit in the depth dimension of the display device; and
    a sealing member formed between the non-display areas of the first and second substrates to surround the display areas,
    wherein the sealing member comprises a first portion not overlapping the internal circuit unit in the depth dimension of the display device and a second portion at least partially overlapping the internal circuit unit in the depth dimension of the display device,
    wherein a groove is formed in the thinner portion of the second substrate at a position corresponding to the second portion of the sealing member, wherein the second portion of the sealing member completely fills the entirety of the groove, wherein the first portion of the sealing member is in direct physical contact with the thicker portion of the second substrate, wherein the second portion of the sealing member surrounds and directly contacts at least three sides of the insulating layer,
    wherein a thickness of the thicker portion of the second substrate is equal to a thickness of a portion of the second substrate which is disposed over the display area,
    wherein the insulating layer includes a top surface, a bottom surface opposing the top surface and facing the first substrate, first and second side surfaces opposing each other, and wherein the three sides of the insulating layer include the top surface, and the first and second side surfaces.

2. The display device of claim 1, wherein an upper part of the second portion is accommodated in the groove.

3. The display device of claim 1, wherein the first portion is a cured portion, and wherein the second portion is a non-cured portion.

4. The display device of claim 1, wherein the first portion has a height less than that of the second portion.

5. The display device of claim 1, further comprising a touch electrode pattern formed over the second substrate.

6. The display device of claim 5, wherein an end portion of the touch electrode pattern at least partially overlaps the second portion of the sealing member.

7. The display device of claim 5, wherein the touch electrode pattern is formed on a first surface of the second substrate, and wherein the groove is formed in a second surface of the second substrate, the second surface being opposite the first surface and facing the first substrate.

8. The display device of claim 1, wherein the non-display area of the first substrate comprises:
    a sealing area in which the sealing member is formed; and
    an internal circuit area in which the internal circuit unit is formed, wherein at least a portion of the sealing area is farther from the display area than the internal circuit area,
    wherein the sealing area and the internal circuit area at least partially overlap each other,
    wherein the first portion of the sealing member is formed in a region of the sealing area not overlapping the internal circuit area, and
    wherein the second portion of the sealing member is formed in a region of the sealing area overlapping the internal circuit area.

9. A method of manufacturing a display device, the method comprising:
    providing a first substrate, the first substrate comprising a display area in which a plurality of pixels are formed and a non-display area in which an internal circuit unit electrically connected to the pixels is formed, the non-display area surrounding the display area;
    providing an insulating layer interposed between and not directly contacting the first and second substrates, wherein the insulating layer at least partially overlaps the internal circuit unit in the depth dimension of the display device;
    forming a sealing material in the non-display area of the first substrate, a portion of the sealing material overlapping the internal circuit unit, wherein the sealing material comprises a first portion not overlapping the internal circuit unit in the depth dimension of the display device and a second portion at least partially overlapping the internal circuit unit in the depth dimension of the display device;
    placing a second substrate above the first substrate, the second substrate having a groove formed at a position corresponding to the second portion of the sealing material, wherein the second portion of the sealing member completely fills the entirety of the groove, wherein the second substrate has thicker and thinner portions that do not overlap each other, wherein the thicker portion has a thickness greater than that of the thinner portion, wherein the first portion of the sealing member is in direct physical contact with the thicker portion of the second substrate, and wherein the second portion of the sealing material surrounds and directly contacts at least three sides of the insulating layer; and
    curing the sealing material,
    wherein a thickness of the thicker portion of the second substrate is equal to a thickness of a portion of the second substrate which is disposed over the display area,
    wherein the insulating layer includes a top surface, a bottom surface opposing the top surface and facing the first substrate, first and second side surfaces opposing each other, and wherein the three sides of the insulating layer include the top surface, and the first and second side surfaces.

10. The method of claim 9, wherein the forming of the sealing material comprises:
    applying paste comprising an inorganic material; and
    drying and firing the paste to form the sealing material.

11. The method of claim 9,
    wherein the first portion does not overlap the internal circuit unit and
    wherein the second portion at least partially overlaps the internal circuit unit.

12. The method of claim 11, wherein the curing of the sealing material comprises curing the first portion by casting light to the first portion.

13. The method of claim 9, wherein the second substrate comprises a touch electrode pattern formed thereon.

14. The method of claim 13, wherein the touch electrode pattern is formed on a first surface of the second substrate, and wherein the groove is formed in a second surface of the second substrate opposite to the first surface.

15. The method of claim 13, wherein an end portion of the touch electrode pattern is formed above the second portion of the sealing member overlapping the internal circuit unit.

16. A display device, comprising:
- first and second substrates each comprising a display area and a non-display area adjacent to the display area, wherein the second substrate has thicker and thinner portions that do not overlap each other, and wherein the thicker portion has a thickness greater than that of the thinner portion;
- an internal circuit unit formed in the non-display area;
- an insulating layer interposed between and not directly contacting the first and second substrates, wherein the insulating layer at least partially overlaps the internal circuit unit in the depth dimension of the display device; and
- a sealing member formed between the non-display areas of the first and second substrates to surround the display areas,
- wherein the sealing member comprises a first portion not overlapping the internal circuit unit in the depth dimension of the display device and a second portion at least partially overlapping the internal circuit unit in the depth dimension of the display device, wherein the first portion of the sealing member is in direct physical contact with the thicker portion of the second substrate, wherein a groove is formed in the second substrate at a position corresponding to the second portion of the sealing member, wherein the second portion of the sealing member completely fills the entirety of the groove, wherein the second portion of the sealing member surrounds and directly contacts at least three sides of the insulating layer,
- wherein a first distance between the first and second substrates corresponding to the first portion of the sealing member is less than a second distance between the first and second substrates corresponding to the second portion of the sealing member,
- wherein a thickness of the thicker portion of the second substrate is equal to a thickness of a portion of the second substrate which is disposed over the display area,
- wherein the insulating layer includes a top surface, a bottom surface opposing the top surface and facing the first substrate, first and second side surfaces opposing each other, and wherein the three sides of the insulating layer include the top surface, and the first and second side surfaces.

17. The display device of claim 16, wherein an upper part of the second portion is inserted into the groove.

18. The display device of claim 16, further comprising a touch electrode pattern formed over the second substrate, wherein at least a portion of the groove is formed directly below the touch electrode pattern.

* * * * *